(12) United States Patent
Wei et al.

(10) Patent No.: US 12,050,407 B2
(45) Date of Patent: Jul. 30, 2024

(54) LIGHT SOURCE CALIBRATION METHOD AND SYSTEM EMPLOYED IN SOURCE MASK OPTIMIZATION

(71) Applicant: Wuhan Yuwei Optical Software Co., Ltd., Hubei (CN)

(72) Inventors: Haiqing Wei, Hubei (CN); Xianhua Ke, Hubei (CN)

(73) Assignee: WUHAN YUWEI OPTICAL SOFTWARE CO., LTD., Hubei (CN)

( * ) Notice: Subject to any disclaimer, the term of this patent is extended or adjusted under 35 U.S.C. 154(b) by 0 days.

(21) Appl. No.: 17/993,731

(22) Filed: Nov. 23, 2022

(65) Prior Publication Data
US 2024/0085801 A1    Mar. 14, 2024

(30) Foreign Application Priority Data
Sep. 13, 2022   (CN) .......................... 202211109822.4

(51) Int. Cl.
*G03B 21/14*    (2006.01)
*G03F 7/00*    (2006.01)
*G03F 7/20*    (2006.01)

(52) U.S. Cl.
CPC ............................. *G03F 7/70516* (2013.01)

(58) Field of Classification Search
CPC . G03F 7/70516; G02B 27/141; G02B 27/283; G02B 27/0955; H04N 9/3105; H04N 9/3158
See application file for complete search history.

(56) References Cited

U.S. PATENT DOCUMENTS

2006/0126046 A1*   6/2006   Hansen ............... G03F 7/70108
                                                                    355/55

* cited by examiner

*Primary Examiner* — Mesfin T Asfaw
(74) *Attorney, Agent, or Firm* — HSML P.C.

(57) ABSTRACT

Light source calibration methods and systems employed in source mask optimization are provided. The method includes: initializing a light source pattern and a mask pattern; using an SMO algorithm to iteratively optimize the light source pattern and the mask pattern; using a pre-established light source error correction model to correct the light source pattern after each iterative optimization, and updating the light source pattern after each iterative optimization with a corrected light source pattern in a current iteration process. The light source error correction model is established according to an input and output data set consisting of an input target light source pattern and an output actual light source pattern of a PIS. The method includes determining, according to an evaluation criterion or a condition of convergence of iteration of the SMO algorithm, whether the optimization meets a requirement.

11 Claims, 2 Drawing Sheets

LIGHT SOURCE CALIBRATION METHOD AND SYSTEM EMPLOYED IN SOURCE MASK OPTIMIZATION

TECHNICAL FIELD

The present invention pertains to the technical field of lithography, and in particular to a light source calibration method and system employed in source mask optimization.

BACKGROUND ART

As the feature size is further reduced, optimizing an illumination light source or a mask image alone can no longer meet manufacturing requirements on integrated circuits having smaller nodes. Thus, the industry has proposed the Source Mask Optimization (SMO) technology that optimizes both a light source and a mask so as to further improve the lithographic resolution and increase a process window. The SMO is one of critical resolution enhancement techniques for manufacturing integrated circuits of 28 nm or smaller technology nodes.

An illumination light source acquired by a commonly used SMO optimization technique consists of pixels. On a lithographic physical machine, a Programmable Illumination System (PIS) is used to perform programming to control a deflection angle of a micro-mirror array to achieve the shape of an optimized light source pattern. Although the PIS provides more degrees of freedom to the pixel pattern of the illumination light source, partial coupling is still present between pixels of a micro-mirror array due to the limits in a processing techniques and mounting process, so that pixels in an illumination light source pattern do not have fully independent degrees of freedom, that is, the pixels are subjected to potential physical constraints of the corresponding processing process of the PIS. Thus, in the case that potential physical constraints cannot be acquired, light sources generated by means of the SMO experience partial distortion in the process implemented by the PIS hardware technology, eventually resulting in the deteriorated effect of imaging on the lithographic physical machine after SMO optimization.

SUMMARY OF THE INVENTION

In view of the defects in the prior art, an objective of the present invention is to provide a light source calibration method and system employed in source mask optimization, which can effectively avoid distortion of an optimized light source pattern during implementation by a PIS of a lithographic machine, thereby effectively improving a process window. Disclosed in the present disclosure are a light source calibration method and system employed in source mask optimization. The method includes: initializing a light source pattern and a mask pattern; using an SMO algorithm to iteratively optimize the light source pattern and the mask pattern; using a pre-established light source error correction model to correct the light source pattern after each iterative optimization, and updating the light source pattern after each iterative optimization with a corrected light source pattern in a current iteration process, where the light source error correction model is established according to an input and output data set consisting of an input target light source pattern and an output actual light source pattern of a PIS; and determining, according to an evaluation criterion or a condition of convergence of iteration of the SMO algorithm, whether the optimization meets a requirement, and if so, ending the optimization, and outputting the final optimized light source pattern and mask pattern, or if not, starting iteration again. The present disclosure can effectively avoid distortion of an optimized light source pattern during implementation by a lithographic physical machine, thereby effectively improving a process window.

To achieve the above objective, according to a first aspect, provided in the present invention is a light source calibration method employed in source mask optimization, comprising the steps of:

(1) initializing a light source pattern and a mask pattern;
(2) using an SMO algorithm to perform iterative optimization on the light source pattern and the mask pattern;
(3) using a pre-established light source error correction model to correct the light source pattern after each iterative optimization, and updating the light source pattern after each iterative optimization with a corrected light source pattern in a current iteration process, wherein the light source error correction model is established according to an input and output data set consisting of an input target light source pattern and an output actual light source pattern of a PIS; and
(4) determining, according to an evaluation criterion or an iteration convergence condition of the SMO algorithm, whether the optimization meets a requirement, and if so, ending the optimization, and outputting the final optimized light source pattern and mask pattern, or if not, returning to step (2), wherein the evaluation criterion of the SMO algorithm involves inputting the iterative optimized light source pattern and mask pattern to a lithographic imaging system model to perform lithographic imaging, performing calculation, and performing determination according to an image quality parameter.

In the light source calibration method employed in source mask optimization according to the present invention, the error correction model is established according to the input and output data set consisting of the input target light source pattern and the output actual light source pattern of the PIS, and the model is used to correct a light source after each iterative optimization performed by using the SMO algorithm, so that the light source after undergoing each iterative optimization performed by using the SMO algorithm can generate a target light source pattern of high fidelity after passing through the PIS, thereby finally avoiding distortion of an optimized light source during implementation by a lithographic physical machine, and effectively improving a process window.

In an embodiment, in step (3), a method of establishing the light source error correction model specifically comprises:

(a) constructing a target light source data set, inputting each target light source pattern in the target light source data set to the PIS, and then acquiring an actual light source pattern correspondingly outputted by the PIS;
(b) forming the input and output data set of the light source error correction model according to each target light source pattern and the actual light source pattern corresponding thereto; and
(c) using, according to the input and output data set, a nonlinear regression or neural network predictive model method to perform training and model assessment, and establishing the light source error correction model.

In an embodiment, in step (a), the Zernike polynomials or the Legendre polynomials are used to generate a certain number of target light source patterns to construct the target light source data set.

In an embodiment, step (3) specifically comprises:
(3.1) setting an iteratively optimized light source pattern $s_k$ to be an initial input of a correction process, wherein an initial light source pattern of the light source error correction model is $s_{k,\,0}=s_k$, k being the number of iterations in the SMO algorithm;
(3.2) setting the maximum number L of iterations in the correction process and setting a current iterator j to 0;
(3.3) updating an iterator j=j+1 in the correction process, and optimizing a light source pattern to $s_{k,\,j}$ in the correction process by using an optimization method; and
(3.4) determining whether the iterator in the current correction process has reached the maximum number of iterations or determining whether an optimized light source in step (3.3) meets the condition $|f(s_{k,\,j})-s_k|<\varepsilon$, $\varepsilon$ being a set threshold, and if so, updating the light source pattern $s_k$ after the current iteration using the SMO algorithm with the light source pattern $f(s_{k,\,j})$ corrected in the SMO iteration process, or if not, returning to step (3.3).

In an embodiment, in step (3.3), the optimization method is a least square method, a regularization method, or a convex optimization method.

In an embodiment, when whether an iteration meets a requirement is determined according to the iteration convergence condition of the SMO algorithm in step (4), step (2) specifically comprises:
(2.1) setting the maximum number N of iterations in the SMO algorithm, and setting the iterator k to 0;
(2.2) updating the iterator k=k+1; and
(2.3) using the SMO algorithm to iteratively update the light source pattern and the mask pattern, so as to acquire a light source $s_k$ and a mask $m_k$ after the current k-th iterative optimization; and
step (4) specifically comprises: determining whether the iterator k in the SMO algorithm is greater than the set maximum number N of iterations, and if so, ending the optimization, and outputting the final optimized light source pattern and mask pattern, or if not, returning to step (2.2).

In an embodiment, in step (4), the step of determining, according to the evaluation criterion of the SMO algorithm, whether an iteration meets a requirement specifically comprises: inputting the light source pattern and the mask pattern after the iteration to the lithographic imaging system model to perform the lithographic imaging; calculating an image edge placement error (EPE); determining whether the image edge placement error (EPE) is less than a set error; and if so, ending the optimization, and outputting the final optimized light source pattern and mask pattern, or if not, returning to step (2).

In an embodiment, in step (1), an SMO critical pattern selection method based on pattern clustering is used to select critical patterns from a layout to form an initialized mask pattern, or an SMO critical pattern selection method based on spectral analysis is used to select critical patterns from a layout to form an initialized mask pattern.

In an embodiment, in step (1), the initialized light source pattern is set to a light source having a random pixel distribution or a light source having regularized parameters.

According to a second aspect, provided in the present invention is a light source calibration system employed in source mask optimization, comprising:
an initialization module, for initializing a light source pattern and a mask pattern, and transmitting same to an iteration module;
the iteration module, for using an SMO algorithm to iteratively update the light source pattern and the mask pattern, and transmitting same to a correction module;
the correction module, for using a pre-established light source error correction model to correct the light source pattern resulting from each iteration, and using the corrected light source pattern as an updated light source pattern in a current iteration, wherein the light source error correction model is established according to an input and output data set consisting of an input target light source pattern and an output actual light source pattern of a PIS; and
a determination module, for determining, according to an evaluation criterion or an iteration convergence condition of the SMO algorithm, whether the iteration meets a requirement, and if so, ending the optimization, and outputting the final optimized light source pattern and mask pattern, or if not, performing iterative optimization on the light source pattern and the mask pattern again, wherein the evaluation criterion of the SMO algorithm involves inputting the iteratively optimized light source pattern and mask pattern to a lithographic imaging system model to perform lithographic imaging, performing calculation, and performing determination according to an image quality parameter.

In the light source calibration system employed in source mask optimization according to the present invention, the error correction model is established according to the input and output data set consisting of the input target light source pattern and the output actual light source pattern of the PIS, and the model is used to correct a light source after each iterative optimization performed by using the SMO algorithm, so that the light source after undergoing each iterative optimization performed by using the SMO algorithm can generate a target light source pattern of high fidelity after passing through the PIS, thereby finally avoiding distortion of an optimized light source during implementation by a lithographic physical machine, and effectively improving a process window.

DETAILED DESCRIPTION

To make the purpose, technical solution, and advantages of the present invention clearer, the present invention is further described in detail below in connection with the accompanying drawings and embodiments. It should be appreciated that the specific embodiments described here are used merely to explain the present invention and are not used to define the present invention.

Figure 1:
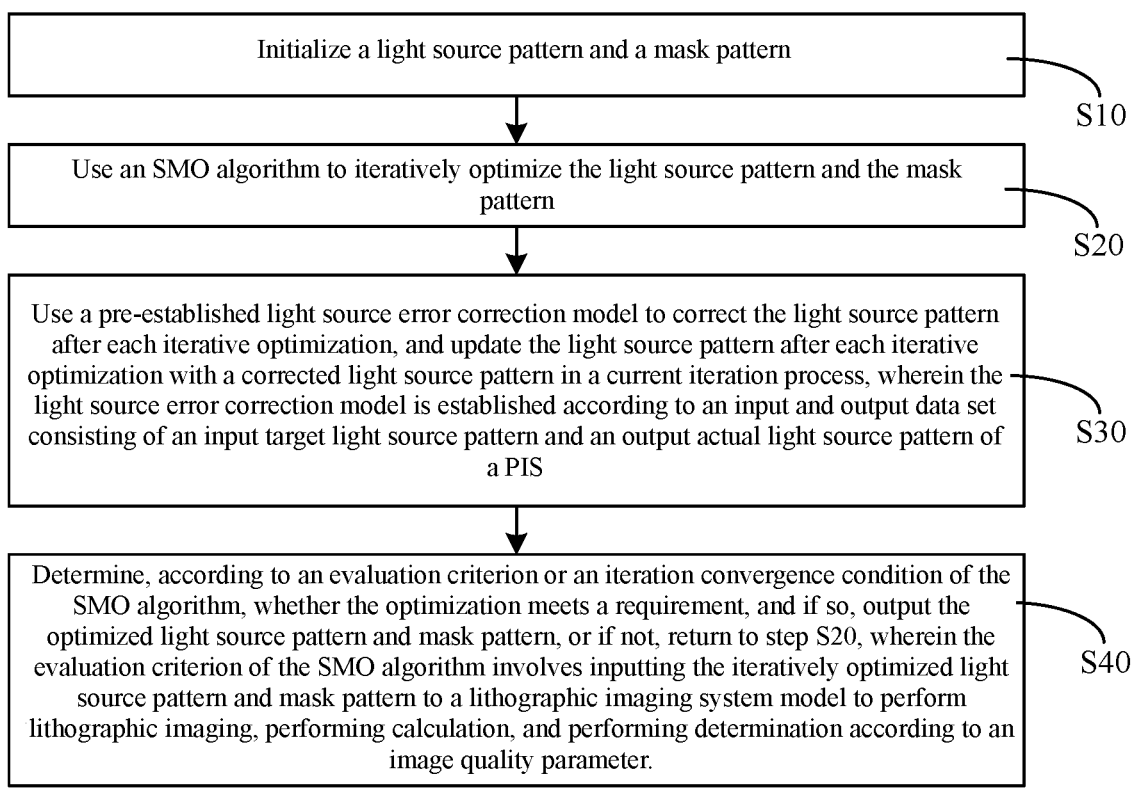
FIG. 1 is a schematic flowchart of a light source calibration method employed in source mask optimization according to an embodiment of the present invention.

To address the problem in which a light source generated by SMO is distorted in a process implemented by a PIS, provided in the present invention is a light source calibration method employed in source mask optimization, as shown in FIG. 1, including steps S10 to S40, specifically as follows:

S10, initializing a light source pattern and a mask pattern, wherein the mask pattern and the light source pattern may be initialized by importing a file or by means of parameter setting.

The initialized light source pattern may set to be a light source having a random pixel distribution or a light source having regularized parameters, and the light source pattern may also be set empirically, which is not limited by the present invention. The initialized mask pattern is a selected SMO critical mask pattern, and may specifically consist of critical patterns selected form a layout. For example, the selection may be performed by using an SMO critical pattern selection method based on pattern clustering or an SMO critical pattern selection method based on spectral analysis.

S20, using an SMO algorithm to iteratively optimize the light source pattern and the mask pattern, which includes, but is not limited to, using methods, such as a gradient algorithm, or a heuristic algorithm, to iteratively optimize the light source and mask patterns.

In step S20, SMO is performed on the selected critical pattern, thereby acquiring an optimized light source suitable for an entire chip. Therefore, an SMO result affects a finally acquired process window.

S30, using a pre-established light source error correction model to correct the light source pattern after each iterative optimization, and updating the light source pattern after each iterative optimization with a corrected light source pattern in a current iteration process. The light source error correction model is established by analyzing a certain number of input and output data sets consisting of an input target light source pattern and an output actual light source pattern of a PIS and by using methods such as machine learning, or deep learning.

In this embodiment, the light source error correction model is established according to the input and output data set consisting of the input target light source pattern and the output actual light source pattern of the PIS, and the model is used to correct a light source after each iterative optimization performed by using the SMO algorithm, so that the light source after undergoing each iterative optimization performed by using the SMO algorithm can generate a target light source pattern of high fidelity after passing through the PIS, thereby finally avoiding distortion of an optimized light source during implementation by a lithographic physical machine, and effectively improving a process window.

S40, determining, according to an evaluation criterion or an iteration convergence condition of the SMO algorithm, whether the optimization meets a requirement, and if so, ending the optimization, and outputting the final optimized light source pattern and mask pattern, or if not, starting iteration again, that is, returning to step S20.

In step S40, to determine whether the optimization performed by using the SMO algorithm meets the requirement, the light source pattern and the mask image iteratively optimized by using the SMO algorithm may be input to a lithographic imaging system model to perform lithographic imaging, and an image quality related parameter of a silicon wafer is calculated. For example, an edge placement error (EPE) is calculated. If the EPE is less than a set error, then optimization is ended. In this embodiment, the EPE is an evaluation function for measuring the quality of pattern correction, and is specifically defined as a difference between a designed exposure profile on an evaluation point and a target. The smaller the EPE is, the closer an exposed pattern is to a designed pattern. The optical imaging system model may be established by using a mathematical model to emulate and simulate a lithographic imaging process and by performing full-link emulation and optimization on system parameters of a lithographic system such as the shape of a light source, a mask pattern, an illumination polarization state, a pupil wavefront phase, etc., and other process parameters. Using the lithographic imaging system model can achieve high-precision compensation for an imaging error, thereby effectively improving the process window and the yield of chip manufacturing.

Certainly, to determine whether the optimization performed by using the SMO algorithm meets the requirement, determination may also be performed according to the number of iterations performed by using the SMO algorithm. Specifically, the maximum number N of iterations in the SMO algorithm is set. It is determined whether the number of iterations of an iterator K in the SMO algorithm is greater than the set maximum number N of iterations, and if so, the optimization is ended.

In the light source calibration method employed in source mask optimization according to this embodiment, the error correction model is established according to the input and output data set consisting of the input target light source pattern and the output actual light source pattern of the PIS, and the model is used to correct a light source after each iterative optimization performed by using the SMO algorithm, so that the light source after undergoing each iterative optimization performed by using the SMO algorithm can generate a target light source pattern of high fidelity after passing through the PIS, thereby finally avoiding distortion of an optimized light source during implementation by a lithographic physical machine, and effectively improving a process window.

Based on the same inventive concept, further provided in the present invention is a light source calibration system employed in source mask optimization, including an initialization module, an iterative optimization module, a correction module, and a determination module.

The initialization module is used for initializing a light source pattern and a mask pattern.

The iterative optimization module is used for using an SMO algorithm to iteratively optimize the light source pattern and the mask pattern.

The correction module is used for using a pre-established light source error correction model to correct the light source pattern after each iterative optimization, and updating the light source pattern after each iterative optimization with a corrected light source pattern in a current iteration process, wherein the light source error correction model is established according to an input and output data set consisting of an input target light source pattern and an output actual light source pattern of a PIS.

The determination module is used for determining, according to an evaluation criterion or an iteration convergence condition of the SMO algorithm, whether the optimization meets a requirement, and if so, ending the optimization, and outputting the final optimized light source pattern and mask pattern, or if not, performing iterative optimization on the light source pattern and the mask pattern again. The evaluation criterion of the SMO algorithm involves inputting the iteratively optimized light source pattern and mask pattern to a lithographic imaging system model to perform lithographic imaging, performing calculation, and performing determination according to an image quality parameter.

Specifically, for the functions of the modules provided in this embodiment, reference can be made to the detailed description in the foregoing method embodiment, and details will not be described herein again.

In the light source calibration system employed in source mask optimization according to this embodiment, the error correction model is established according to the input and output data set consisting of the input target light source pattern and the output actual light source pattern of the PIS, and the model is used to correct a light source after each iterative optimization performed by using the SMO algorithm, so that the light source after undergoing each iterative optimization performed by using the SMO algorithm can generate a target light source pattern of high fidelity after passing through the PIS, thereby finally avoiding distortion of an optimized light source during implementation by a lithographic physical machine, and effectively improving a process window.

In order to more clearly illustrate the light source calibration method employed in source mask optimization according to the present invention, description is correspondingly provided below with reference to specific embodiments.

Figure 2:
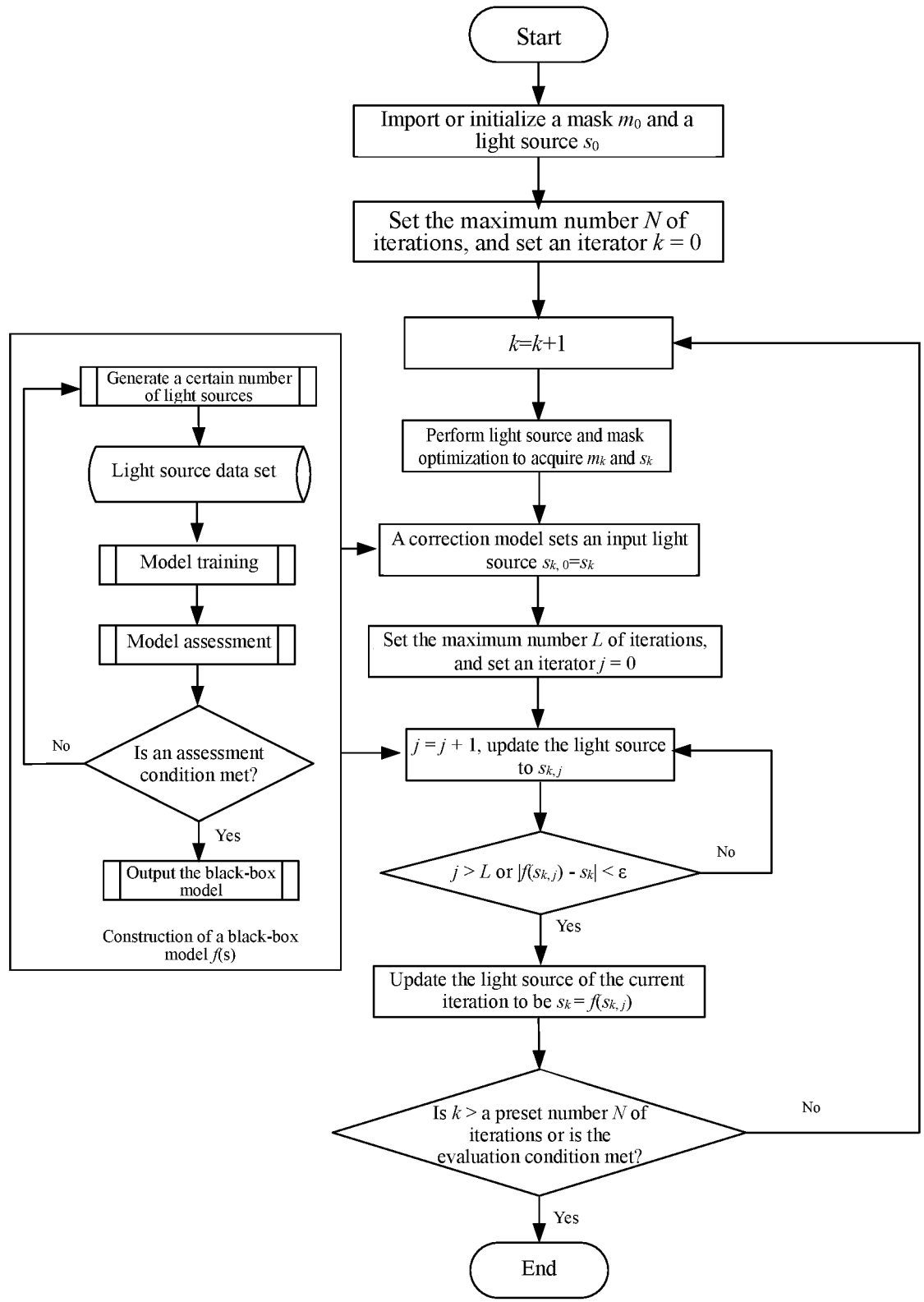
FIG. 2 is a schematic flowchart of a light source calibration method employed in source mask optimization according to a specific embodiment of the present invention

It should be noted that the conventional standardized SMO processes may generally be divided into basic implementation steps such as separate light source optimization, separate mask optimization, synchronous light source—mask optimization, alternate light source—mask optimization, etc. The present invention is applicable to all of the above standardized SMO processes. The present invention is illustrated below by using synchronous light source—mask optimization as an example, which has the following steps as shown in FIG. 2:

Step 1: importing a mask and light source file, and initializing mask and light source patterns.

Step 2: setting the maximum number N of iterations, and setting an iterator k=0.

Step 3: updating the iterator k=k+1.

Step 4: using an SMO algorithm to iteratively optimize the mask and light source patterns, so as to acquire a light source $s_k$ and a mask $m_k$ having been optimized in a current k-th iteration.

Step 5: constructing a black-box model having actual physical constraints of a light source of a lithographic machine, i.e., a light source error correction model. A micro-mirror array PIS is used in a lithographic physical machine to implement a light source. Due to limits in a processing process or mounting techniques, potential physical constraints are present between pixels of the light source. By establishing the black-box model, an actual light source pattern of any light source passing through the PIS can be predicted, which is one of critical steps of correcting distortion caused to the light source by the PIS. During construction of the black-box model having the actual physical constraints of the light source of the lithographic machine, a deep learning method is used to construct the black-box model f(s). That is, when a light source input s is provided, a corresponding output f(s) can be acquired. A basic process includes the following sub steps:

Step 5.1: generating a certain number of light sources so as to construct a light source data set. A certain number of linearly independent light sources are generated by using substantially perfect polynomials. For example, a certain number of target light sources may be generated by using the Zernike polynomials, the Legendre polynomials, etc., so as to ensure diversity of the data set.

Step 5.2: constructing the light source data set, wherein the target light sources in step 5.1 are inputted to the PIS to acquire and record actual light sources correspondingly acquired by the PIS. An input and output data set of the light source correction model is formed according to target light source and actual light source patterns. The acquired data set is divided into two parts: one part is used for model training, and the other part is used for model assessment.

Step 5.3: performing training according to a data set consisting of input and output light sources. The present invention does not set limitations on a specific training method, that is, does not set limitations on a neural network structure and a back propagation algorithm corresponding thereto. A loss function in a training process is defined as a difference between an actual light source and a light source outputted from training, and description of the difference is not limited to the 2-norm, etc.

Step 5.4: using the input and output light source data set, which is used for model assessment, to assess the model generated by means of the training, where this part of data corresponds to the loss function.

Step 5.5: determining, according to whether the loss function meets a requirement, whether a model assessment condition is met, and if an affirmative result is obtained, proceeding to step 5.6 to output the black-box model, or if a negative assessment result is obtained, proceeding to step 5.1 to increase the number of generated light sources and then repeat the training.

Step 6: setting a light source $s_k$ currently iteratively optimized using SMO to be an initial input of a correction process, wherein an initial light source pattern of the light source error correction model is $s_{k,0}=s_k$.

Step 7: setting the maximum number L of iterations in the correction process and a current iterator j=0.

step 8: updating an iterator j=j+1 in the correction process, and iteratively updating a light source pattern to $s_{k,j}$ in the correction process by using an optimization method, wherein the present invention does not set limitations on the optimization method, and the light source may be updated by using a least square method, a regularization method, a convex optimization method, or the like.

Step 9: determining whether the iterator in the current correction process has reached the maximum number of iterations, that is, j>L, or determining whether an optimized light source in step 8 meets the condition $|f(s_{k,j})-s_k|<\varepsilon$, $\varepsilon$ being an acceptable threshold, and if an affirmative determination result is obtained, proceeding to step 10, or if a negative determination result is obtained, proceeding to step 8 to update light sources again.

Step 10: updating the light source $s_k=f(s_{k,j})$ in the current SMO iteration, and using the same as the corrected light source in the SMO iteration process.

Step 11: determining whether the iterator k in the SMO iteration is greater than the set maximum number N of iterations, or whether a light source and mask result of SMO meets an evaluation condition, and if an affirmative result is obtained, ending the optimization, and outputting the final optimized light source pattern and mask pattern, or if a negative result is obtained, proceeding to step 3.

In step S11, to evaluate whether the light source and mask result of the SMO meets the evaluation condition, a conventional SMO evaluation method may be used. For example, the iteratively optimized light source and mask are input to a lithographic imaging system model to perform lithographic imaging, and an image quality related parameter of a silicon wafer is calculated. For example, an edge placement error (EPE) is calculated, and is used as an evaluation function to evaluate the quality of pattern correction. The EPE is defined as a difference between a designed exposure profile on an evaluation point and a target. The smaller the EPE is, the closer an exposed pattern is to a designed pattern. For example, a process window corresponding to the light source and mask is calculated, that is, ranges of an exposure dose and a defocusing amount that ensure that a mask pattern can be correctly copied to a silicon wafer are calculated. The larger the process window is, the better the SMO effect is.

In this specific embodiment, step 5 to step 10 constitute the light source correction process. The black-box model acquired by means of training is used to correct the light source in the iteration process performed using the SMO algorithm, so that the light source optimized in each iteration can generate a target light source pattern of high fidelity after passing through the PIS, thereby finally avoiding distortion of an optimized light source during implementation by a lithographic physical machine, and effectively improving the process window.

It can be easily understood by those skilled in the art that the foregoing description is only preferred embodiments of the present invention and is not intended to limit the present invention. All the modifications, identical replacements and improvements within the spirit and principle of the present invention should be in the scope of protection of the present invention.

The invention claimed is:

1. A light source calibration method employed in source mask optimization, comprising:
   (1) initializing a light source pattern and a mask pattern;
   (2) using a source mask optimization (SMOG algorithm to iteratively optimize the light source pattern and the mask pattern;
   (3) using a pre-established light source error correction model to correct the light source pattern after each iterative optimization, and updating the light source pattern after each iterative optimization with a corrected light source pattern in a current iteration process, wherein the light source error correction model is established according to an input and output data set consisting of one or more input target light source patterns and one or more actual light source patterns correspondingly output by a programmable illumination system (PIS); and
   (4) determining, according to an evaluation criterion or an iteration convergence condition of the SMO algorithm, whether the optimization meets a requirement, and if so, ending the optimization, and outputting the final optimized light source pattern and mask pattern, or if not, returning to the step (2), wherein the evaluation criterion of the SMO algorithm involves inputting the iteratively optimized light source pattern and mask pattern to a lithographic imaging system model to perform lithographic imaging, performing calculation, and performing determination according to an image quality parameter.

2. The light source calibration method according to claim 1, wherein in the step (3), a method of establishing the light source error correction model comprises:
   (a) constructing a target light source data set of the one or more input target light source patterns, inputting each of the one or more input target light source patterns in the target light source data set to the PIS, and then acquiring each of the one or more actual light source patterns correspondingly output by the PIS;
   (b) forming the input and output data set of the light source error correction model according to the one or more target light source patterns and the one or more actual light source patterns corresponding thereto; and
   (c) using, according to the input and output data set, a nonlinear regression or neural network predictive model method to perform training and model assessment, and establishing the light source error correction model.

3. The light source calibration method according to claim 2, wherein in the step (a), Zernike polynomials or Legendre polynomials are used to generate a certain number of the one or more input target light source patterns to construct the target light source data set.

4. The light source calibration method according to claim 1, wherein the step (3) comprises:
   (3.1) setting an iteratively optimized light source pattern $s_k$ to be an initial input of a correction process, wherein an initial light source pattern of the light source error correction model is $s_{k,\,0} = s_k$, k being the number of iterations in the SMO algorithm;
   (3.2) setting a maximum number L of iterations in the correction process and setting a current iterator j to 0;
   (3.3) updating the iterator j=j+1 in the correction process, and optimizing a light source pattern to $s_{k,j}$ in the correction process by using an optimization method; and
   (3.4) determining whether an iterator in the current correction process has reached the maximum number of iterations or determining whether the optimized light source pattern in the step (3.3) meets the condition $|f(s_{k,j}) - s_k| < \varepsilon$, $\varepsilon$ being a set threshold, and if so, updating the light source pattern $s_k$ after the current iteration using the SMO algorithm with the light source pattern $f(s_{k,\,j})$ corrected in the SMO iteration process, or if not, returning to step (3.3).

5. The light source calibration method according to claim 4, wherein in the step (3.3), the optimization method is a least square method, a regularization method, or a convex optimization method.

6. The light source calibration method according to claim 1, wherein when whether an iteration meets a requirement is determined according to the iteration convergence condition of the SMO algorithm in the step (4),
   the step (2) comprises:
   (2.1) setting a maximum number N of iterations in the SMO algorithm, and setting an iterator k to 0;
   (2.2) updating the iterator k=k+1; and
   (2.3) using the SMO algorithm to iteratively update the light source pattern and the mask pattern, so as to acquire a light source $s_k$ and a mask $m_k$ after the current k-th iterative optimization; and
   the step (4) specifically comprises: determining whether the iterator k in the SMO algorithm is greater than the set maximum number N of iterations, and if so, ending the optimization, and outputting the final optimized light source pattern and mask pattern, or if not, returning to the step (2.2).

7. The light source calibration method according to claim 1, wherein in the step (4), the step of determining, according to the evaluation criterion of the SMO algorithm, whether an iteration meets a requirement specifically comprises: inputting the light source pattern and the mask pattern after the iteration to the lithographic imaging system model to perform the lithographic imaging; calculating an image edge placement error (EPE); determining whether the image edge placement error (EPE) is less than a set error; and if so, ending the optimization, and outputting the final optimized light source pattern and mask pattern, or if not, returning to the step (2).

8. The light source calibration method according to claim 1, wherein in the step (1), an SMO critical pattern selection method based on pattern clustering is used to select critical patterns from a layout to form an initialized mask pattern, or an SMO critical pattern selection method based on spectral analysis is used to select critical patterns from a layout to form an initialized mask pattern.

9. The light source calibration method according to claim 1, wherein in the step (1), the initialized light source pattern is set to a light source having a random pixel distribution or a light source having regularized parameters.

10. The light source calibration method according to claim 1, the one or more input target light source patterns being two or more input target light source patterns, and the one or more actual light source patterns being two or more actual light source patterns correspondingly output by a programmable illumination system (PIS).

11. A light source calibration system employed in source mask optimization, comprising:
an initialization module, for initializing a light source pattern and a mask pattern, and transmitting same to an iteration module;
the iteration module, for using an SMO algorithm to iteratively update the light source pattern and the mask pattern, and transmitting same to a correction module;
the correction module, for using a pre-established light source error correction model to correct the light source pattern resulting from each iteration, and using the corrected light source pattern as an updated light source pattern in a current iteration, wherein the light source error correction model is established according to an input and output data set consisting of one or more input target light source patterns and one or more actual light source patterns correspondingly output by a PIS; and
a determination module, for determining, according to an evaluation criterion or an iteration convergence condition of the SMO algorithm, whether the iteration meets a requirement, and if so, ending the optimization, and outputting the final optimized light source pattern and mask pattern, or if not, performing iterative optimization on the light source pattern and the mask pattern again, wherein the evaluation criterion of the SMO algorithm involves inputting the iteratively optimized light source pattern and mask pattern to a lithographic imaging system model to perform lithographic imaging, performing calculation, and performing determination according to an image quality parameter.

* * * * *